United States Patent
Baba et al.

(10) Patent No.: US 10,175,303 B2
(45) Date of Patent: Jan. 8, 2019

(54) BATTERY PARAMETER ESTIMATION DEVICE AND PARAMETER ESTIMATION METHOD

(71) Applicants: CALSONIC KANSEI CORPORATION, Saitama-shi, Saitama (JP); KEIO UNIVERSITY, Minato-ku, Tokyo (JP); KYOTO UNIVERSITY, Kyoto-shi, Kyoto (JP)

(72) Inventors: Atsushi Baba, Saitama (JP); Shuichi Adachi, Tokyo (JP); Ichiro Maruta, Kyoto (JP)

(73) Assignees: CALSONIC KANSEI CORPORATION, Saitama-shi, Saitama (JP); KEIO UNIVERSITY, Minato-ku, Tokyo (JP); KYOTO UNIVERSITY, Kyoto-shi, Kyoto (JP)

( * ) Notice: Subject to any disclaimer, the term of this patent is extended or adjusted under 35 U.S.C. 154(b) by 293 days.

(21) Appl. No.: 15/030,658

(22) PCT Filed: Oct. 3, 2014

(86) PCT No.: PCT/JP2014/005059
§ 371 (c)(1),
(2) Date: Apr. 20, 2016

(87) PCT Pub. No.: WO2015/059879
PCT Pub. Date: Apr. 30, 2015

(65) Prior Publication Data
US 2016/0252585 A1   Sep. 1, 2016

(30) Foreign Application Priority Data

Oct. 21, 2013  (JP) .................................. 2013-218663

(51) Int. Cl.
*G01R 31/36* (2006.01)
*H01M 10/48* (2006.01)
(Continued)

(52) U.S. Cl.
CPC ......... *G01R 31/3662* (2013.01); *G01R 31/36* (2013.01); *G01R 31/3648* (2013.01);
(Continued)

(58) Field of Classification Search
CPC ............ G01R 31/3651; G01R 31/3662; G01R 31/3679; G01R 31/3606; G01R 31/3624; G01R 31/3648
See application file for complete search history.

(56) References Cited

U.S. PATENT DOCUMENTS 9,784,794 B2 * 10/2017 Itabashi ................. G01R 31/36
9,869,724 B2 *  1/2018 Kimura ................ G01R 31/362
(Continued)

FOREIGN PATENT DOCUMENTS

JP   H04-95788 A   3/1992
JP   H11-32442 A   2/1999
(Continued)

OTHER PUBLICATIONS

Dec. 16, 2014, International Search Report issued in the International Patent Application No. PCT/JP2014/005059.
(Continued)

*Primary Examiner* — Jaehwan Oh
(74) *Attorney, Agent, or Firm* — Kenja IP Law PC

(57) ABSTRACT

An apparatus and method for battery parameter estimation estimate the parameters of a battery equivalent circuit model while reducing the computation load. The apparatus includes a charge/discharge current detector (3) that detects a charge/discharge current value of a battery (1); a terminal voltage detector (2) that detects a terminal voltage value of
(Continued)

the battery (1); and an estimator (4) that estimates, based on the charge/discharge current value and the terminal voltage value, parameters in a battery equivalent circuit model (41) that approximates the Warburg impedance of the battery (1).

9 Claims, 6 Drawing Sheets

(51) Int. Cl.
  *H02J 7/00* (2006.01)
  *H01M 10/42* (2006.01)
(52) U.S. Cl.
  CPC ........ *G01R 31/3651* (2013.01); *H01M 10/48* (2013.01); *H02J 7/0021* (2013.01); *G01R 31/3624* (2013.01); *H01M 2010/4271* (2013.01); *Y02T 10/7055* (2013.01)

(56) References Cited

U.S. PATENT DOCUMENTS

| | | | | |
|---|---|---|---|---|
| 2001/0035739 A1* | 11/2001 | Laig-Horstebrock | ...................... | G01R 31/3648 320/132 |
| 2009/0096459 A1* | 4/2009 | Yoneda | .............. | G01R 31/3651 324/430 |
| 2011/0173585 A1* | 7/2011 | Hamano | ............. | G01R 31/3651 716/133 |
| 2012/0130662 A1* | 5/2012 | Dong | ................. | G01R 31/3651 702/63 |
| 2012/0268060 A1* | 10/2012 | Chen | ........................ | H02J 7/04 320/107 |
| 2013/0141109 A1* | 6/2013 | Love | .................. | G01R 31/3606 324/430 |
| 2013/0169281 A1 | 7/2013 | Baba et al. | | |
| 2013/0179103 A1* | 7/2013 | Luo | ..................... | G01R 31/3662 702/63 |
| 2013/0185008 A1* | 7/2013 | Itabashi | ............. | G01R 31/3651 702/63 |
| 2015/0032394 A1* | 1/2015 | Kimura | ................. | G01R 31/362 702/63 |
| 2015/0260800 A1* | 9/2015 | Baba | .................. | G01R 31/3651 702/63 |
| 2015/0326038 A1* | 11/2015 | Lee | ........................ | H01M 10/48 320/134 |
| 2016/0001657 A1* | 1/2016 | Koller | ..................... | B60L 3/003 307/10.1 |
| 2016/0001672 A1* | 1/2016 | Lee | ..................... | B60L 11/1864 320/136 |
| 2016/0116542 A1* | 4/2016 | Baba | .................. | B60L 11/1851 702/63 |
| 2016/0187429 A1* | 6/2016 | Kawai | ................ | G01R 31/3651 702/63 |
| 2017/0259684 A1* | 9/2017 | Lee | ..................... | B60L 11/1848 |
| 2017/0315179 A1* | 11/2017 | Baba | .................. | G01R 31/3651 |

FOREIGN PATENT DOCUMENTS

| | | |
|---|---|---|
| JP | 2010-262896 A | 11/2010 |
| JP | 2011-122917 A | 6/2011 |
| JP | 2011-122918 A | 6/2011 |
| JP | 2012-058089 A | 3/2012 |
| JP | 2012-063244 A | 3/2012 |
| JP | 2013-110082 A | 6/2013 |

OTHER PUBLICATIONS

Feb. 27, 2017, Office Action issued by the State Intellectual Property Office in the corresponding Chinese Patent Application No. 201480057816.6 with English language Concise Explanation of the relevance.

\* cited by examiner

BATTERY PARAMETER ESTIMATION DEVICE AND PARAMETER ESTIMATION METHOD

CROSS-REFERENCE TO RELATED APPLICATION

This application claims priority to and the benefit of Japanese Patent Application No. 2013-218663 filed Oct. 21, 2013, the entire contents of which are incorporated herein by reference.

TECHNICAL FIELD

This disclosure relates to an apparatus and method for battery parameter estimation that can sequentially estimate the parameters of a battery equivalent circuit model using a Kalman filter.

BACKGROUND

An example of a conventional apparatus for estimating the internal state and the parameters of a battery is disclosed in JP 2012-58089 A (PTL 1). This conventional apparatus for battery parameter estimation detects the charge/discharge current and terminal voltage of a battery, and with these values as inputs, estimates (calculates) the parameters and the internal state quantity and open circuit voltage value of the battery with a Kalman filter using a battery equivalent circuit model. A Foster-type RC ladder circuit, for example, is used as the battery equivalent circuit model.

CITATION LIST

Patent Literature

PTL 1: JP 2012-58089 A

SUMMARY

Technical Problem

Since batteries operate by complex chemical reactions, however, the estimated value may differ from the real value in a simplified equivalent circuit model. Attempting to use an equivalent circuit model with an increased number of resisters or capacitors in order to increase the accuracy of the estimated value, however, increases the number of parameters to be estimated, thereby increasing the computation load. It has therefore been difficult to perform estimation using a second order or higher equivalent circuit model in a Foster-type RC ladder circuit.

Therefore, it would be helpful to provide an apparatus and method for battery parameter estimation that estimate the parameters of a battery equivalent circuit model while reducing the computation load.

Solution to Problem

In order to resolve the afore-mentioned problem, an apparatus for battery parameter estimation according to a first aspect of this disclosure includes:
  a charge/discharge current detector configured to detect a charge/discharge current value of a battery;
  a terminal voltage detector configured to detect a terminal voltage value of the battery; and
  an estimator configured to estimate, based on the charge/discharge current value and the terminal voltage value, parameters in a battery equivalent circuit model that approximates a Warburg impedance of the battery.

The battery parameters to be estimated include internal resistance $R_0$, n-th order resistance $R_1$ to $R_n$, and n-th order capacitance $C_1$ to C. When approximating the below-described Warburg impedance, the parameters to be estimated include the internal resistance $R_0$, diffusion resistance $R_d$, diffusion capacitance $C_d$, state of health SOH, and state of charge SOC.

In an apparatus for battery parameter estimation according to a second aspect of this disclosure, the estimator estimates at least a diffusion resistance $R_d$ and a diffusion capacitance $C_d$ by approximation of the Warburg impedance.

In an apparatus for battery parameter estimation according to a third aspect of this disclosure, the equivalent circuit model is an n-th order Foster equivalent circuit model, and
  the estimator calculates the parameters with the following equations:

$$C_n = \frac{C_d}{2}$$

$$R_n = \frac{8R_d}{(2n-1)^2\pi^2}.$$

In an apparatus for battery parameter estimation according to a fourth aspect of this disclosure, the equivalent circuit model is an n-th order Cauer equivalent circuit model, and
  the estimator calculates the parameters with the following equations:

$$C_n = \frac{C_d}{4n-1}$$

$$R_n = \frac{R_d}{4n-3}.$$

In an apparatus for battery parameter estimation according to a fifth aspect of this disclosure, the estimator estimates an internal state quantity of the battery at a same time as the parameters in the equivalent circuit model.

A method for battery parameter estimation according to a sixth aspect of this disclosure includes:
  detecting a charge/discharge current value of a battery;
  detecting a terminal voltage value of the battery; and
  estimating, based on the charge/discharge current value and the terminal voltage value, parameters in a battery equivalent circuit model that approximates a Warburg impedance of the battery.

Advantageous Effect

The apparatus for battery parameter estimation according to the first aspect of this disclosure approximates the Warburg impedance $Z_w$ of the battery, thereby allowing the Warburg impedance $Z_w$ to be converted into the time domain and allowing the parameters of the battery equivalent circuit model to be estimated.

The apparatus for battery parameter estimation according to the second aspect of this disclosure allows other parameters of the battery equivalent circuit model (resistance R, capacitance C) to be calculated using the estimated diffusion resistance $R_d$ and diffusion capacitance $C_d$. Therefore, even if the order of the battery equivalent circuit model increases, the number of parameters to be estimated does not change, thereby allowing the computation load to be reduced.

The apparatus for battery parameter estimation according to the third aspect of this disclosure allows other parameters to be calculated using the estimated diffusion resistance $R_d$ and diffusion capacitance $C_d$ when using an n-th order Foster-type circuit as the battery equivalent circuit model.

The apparatus for battery parameter estimation according to the fourth aspect of this disclosure allows other parameters to be calculated using the estimated diffusion resistance $R_d$ and diffusion capacitance $C_d$ when using an n-th order Cauer-type circuit as the battery equivalent circuit model.

The apparatus for battery parameter estimation according to the fifth aspect of this disclosure estimates the internal state quantity of the battery at the same time as the parameters of the battery equivalent circuit model, thereby allowing the estimation accuracy of the internal state quantity to be improved.

The method for battery parameter estimation according to the sixth aspect of this disclosure approximates the Warburg impedance $Z_w$ of the battery, thereby allowing the Warburg impedance $Z_w$ to be converted into the time domain and allowing the parameters of the battery equivalent circuit model to be estimated.

DETAILED DESCRIPTION

The following describes one of the embodiments of this disclosure.

Embodiment

The following describes the apparatus for battery parameter estimation of this embodiment with reference to the attached drawings. The apparatus for battery parameter estimation of this embodiment is used in a vehicle, such as an electric vehicle, a hybrid electric vehicle, or the like. An electric motor that drives the vehicle, a battery, a controller for the electric motor and battery, and the like are mounted in such a vehicle. Power is supplied (discharged) to the electric motor, braking energy is recovered from the electric motor when braking, and power is collected (charged) into the battery from a ground-based charging facility. When there is such input and output of charge/discharge current to and from the battery, the internal state of the battery changes. By monitoring while estimating this internal state with an apparatus for battery parameter estimation, necessary information is collected, such as the remaining battery charge.

Figure 1:
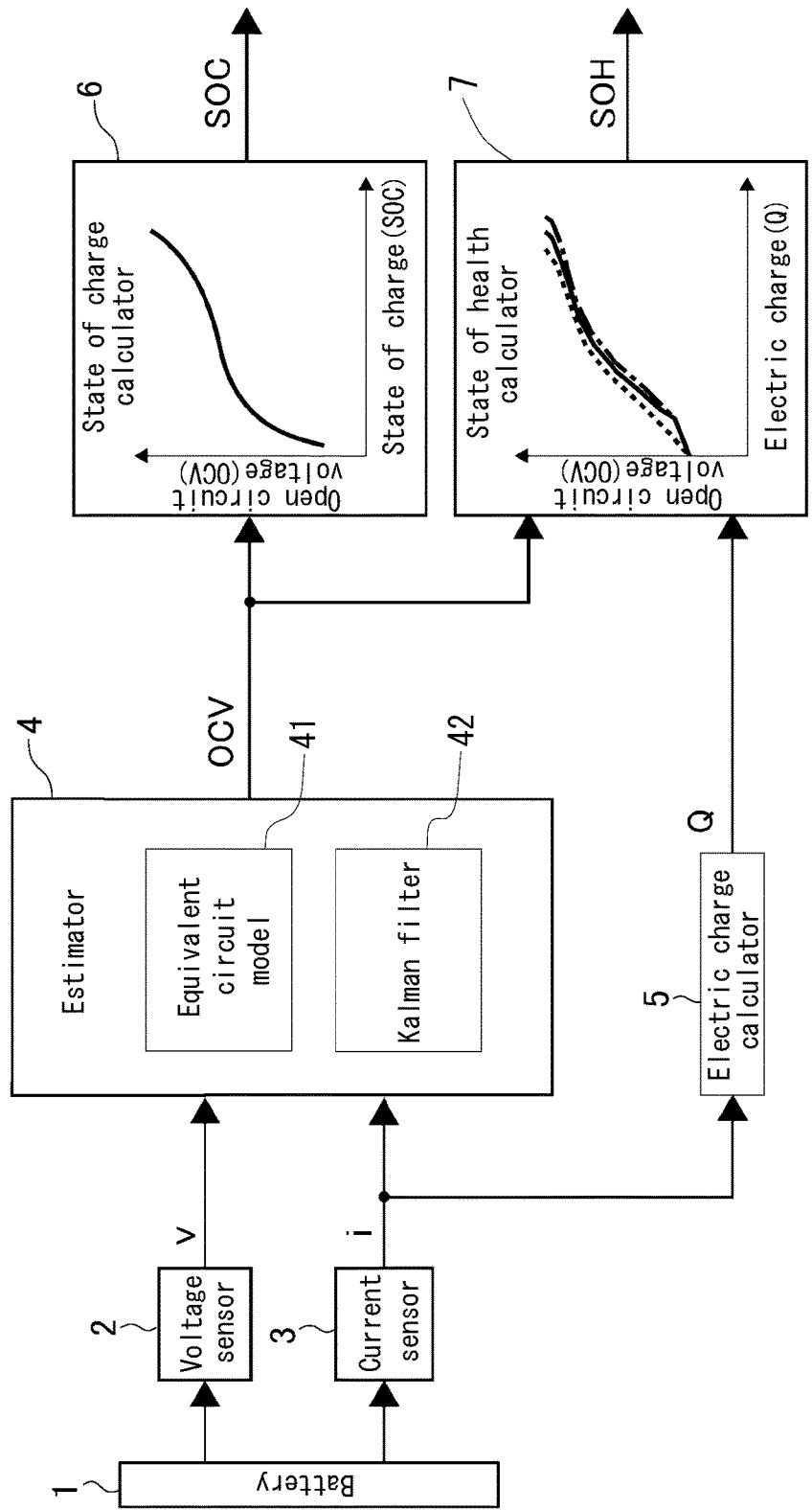
FIG. 1 is a functional block diagram of an apparatus for battery parameter estimation, according to an embodiment of this disclosure, connected to a battery.

As illustrated in FIG. 1, the apparatus for parameter estimation of the battery 1 includes a voltage sensor (terminal voltage detector) 2, a current sensor (charge/discharge current detector) 3, an estimator 4, an electric charge calculator 5, a state of charge calculator 6, and a state of health calculator 7. The estimator 4, electric charge calculator 5, state of charge calculator 6, and state of health calculator 7 are, for example, configured using an in-vehicle microcomputer.

The battery 1 is, for example, a rechargeable battery (secondary cell). While the battery 1 is described as being a lithium-ion battery in this embodiment, a different type of battery may be used.

The terminal voltage detector 2 is, for example, a voltage sensor and detects a terminal voltage value v of the battery 1. The terminal voltage detector 2 inputs the detected terminal voltage value v into the estimator 4.

The charge/discharge current detector 3 is, for example, a current sensor and detects a charge/discharge current value i of the battery 1. The charge/discharge current detector 3 inputs the detected charge/discharge current value i into the estimator 4.

The estimator 4 includes a battery equivalent circuit model 11 of the battery 1 and a Kalman filter 42. Using the Kalman filter 42, the estimator 4 can estimate (calculate) parameter values of the battery equivalent circuit model 41, the Open Circuit Voltage (OCV) of the battery 1, and the internal state quantity of the battery 1. In this embodiment, based on the terminal voltage value v from the terminal voltage detector 2 and the charge/discharge current value i from the charge/discharge current detector 3, the estimator 4 estimates the parameter values and the internal state quantity simultaneously, and calculates the open circuit voltage OCV based on the estimated parameter values. Details on the estimation/calculation processing executed by the estimator 4 are described below. The estimator 4 inputs the calculated open circuit voltage OCV into the state of charge calculator 6 and the state of health calculator 7.

As described below, the battery equivalent circuit model 41 is configured with a Foster-type RC ladder circuit, represented by approximation using the sum of an infinite series, in which a parallel circuit of resistors and capacitors is connected, or a Cauer-type RC ladder circuit, represented by approximation using a continued-fraction expansion, in which resistors connected in series are grounded with capacitors therebetween. The resistors and capacitors become the parameters of the battery equivalent circuit model 41.

In the Kalman filter 42, a model of the target system is designed (in this embodiment, a battery equivalent circuit model 41), the same input signal is input into this model and the actual system, and the outputs from the model and the actual system in this case are compared. If there is error in the outputs, the Kalman filter 42 applies Kalman gain to the error and provides feedback to the model, thereby adjusting the model to minimize the error in the outputs. By repeating this process, the parameters of the model are estimated.

The charge/discharge current value i of the battery 1 detected by the charge/discharge current detector 3 is input into the electric charge calculator 5, which sequentially integrates this value to determine the electric charge that has been input into or output from the battery 1. By subtracting the electric charge that has been input or output from the remaining electric charge that was stored before the sequential integration computation, the electric charge calculator 5 calculates the electric charge Q that the battery 1 currently has. The electric charge Q is output to the state of health calculator 7.

The relationship between the open circuit voltage value and the state of charge is not easily affected by temperature or by degradation of the battery 1. Therefore, to determine this relationship, relational data are obtained in advance by experiment and stored, for example as a characteristic table, by the state of charge calculator 6. Based on this characteristic table, the state of charge (SOC) at a certain time is estimated from the open circuit voltage estimated value that was estimated by the estimator 4. This state of charge SOC is used for battery management of the battery 1.

The state of health calculator 7 includes a characteristic table that represents the relationship between the electric charge Q and the open circuit voltage OCV for each state of health SOH segmented by a predetermined width. Details on the characteristic table are, for example, disclosed in JP 2012-57956 A, submitted by the present applicant. The open circuit voltage OCV estimated by the estimator 4 and the electric charge Q calculated by the electric charge calculator 5 are input into the state of health calculator 7, which calculates the state of health SOH, among the states of health in the characteristic table, into whose range these values fall and outputs that state of health SOH.

The equivalent circuit model 41 of the battery 1 is now described. In general, battery electrode reactions include a charge transfer process at the interface between the electrolyte solution and the active material and a diffusion process of ions in the electrolyte solution or the active material. For example, in a physical process (non-Faradaic process) battery such as a lithium-ion battery, i.e. a battery in which the diffusion phenomenon is dominant, the effect of Warburg impedance, which is impedance caused by the diffusion process, is dominant.

Figure 2:
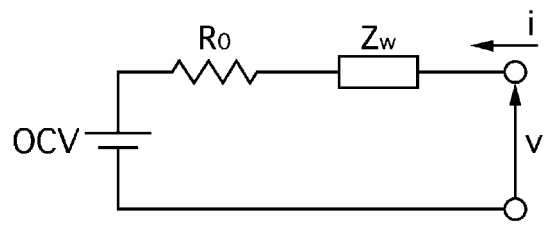
FIG. 2 illustrates a battery equivalent circuit model.

First, as illustrated in FIG. 2, as the battery model, an open circuit that has open voltage (open circuit voltage) OCV and in which an internal resistance $R_0$ and a Warburg impedance $Z_w$ are connected in series is assumed.

Figure 3:
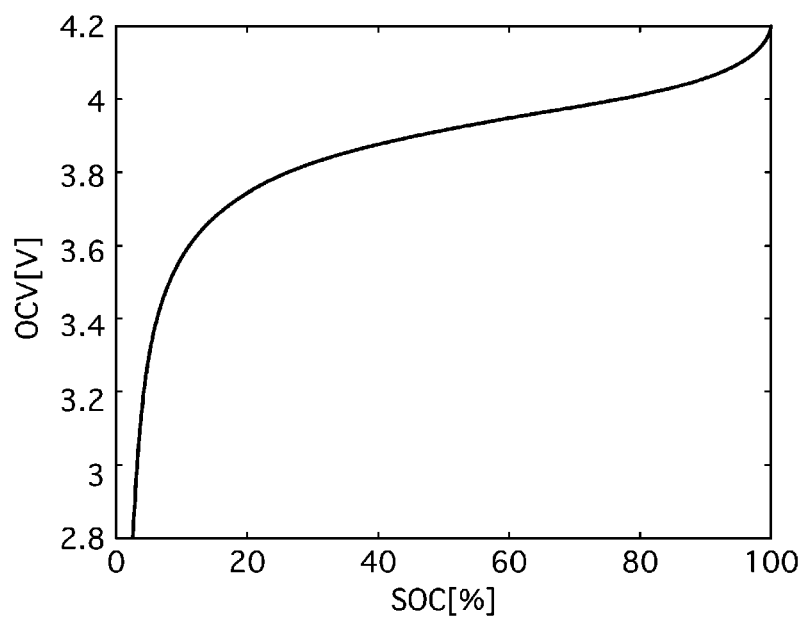
FIG. 3 illustrates the relationship between the open circuit voltage and state of charge of a battery.

The open circuit voltage OCV becomes a non-linear function of the state of charge SOC, such as the function illustrated in FIG. 3. The state of charge SOC is represented by Equation (1) using the charge/discharge current value i and the full charge capacity FFC.

$$\frac{d}{dt}SOC = \frac{i}{FCC} \tag{1}$$

The transfer function of the Warburg impedance $Z_w$ is represented by Equation (2):

$$Z_W(s) = \frac{R_d}{\sqrt{\tau_d s}} \tanh\sqrt{\tau_d s} \tag{2}$$

where s is the Laplace operator and the diffusion resistance $R_d$ is the low-frequency limit of $Z_w(s)$ ($\omega \to 0$). The diffusion time constant $\tau_d$ stands for the speed of the diffusion reaction. Using the diffusion resistance $R_d$ and the diffusion time constant $\tau_d$, the diffusion capacitance $C_d$ is defined by Equation (3).

$$C_d := \frac{\tau_d}{R_d} \tag{3}$$

In Equation (2), the square root of the Laplace operator s exists, making it difficult to transform the Warburg impedance $Z_w$ directly into the time domain. Therefore, an approximation of the Warburg impedance $Z_w$ is considered. The Warburg impedance $Z_w$ may, for example, be approximated with the sum of an infinite series or with a continued-fraction expansion.

First, approximation with the sum of an infinite series is described. As shown in Equation (4), the Warburg impedance $Z_w$ can be represented as the sum of an infinite series:

$$Z_W(s) = \sum_{n=1}^{\omega} \frac{R_n}{sC_n R_n + 1} \tag{4}$$

where the following holds.

$$C_n = \frac{C_d}{2} \tag{5}$$

$$R_n = \frac{8R_d}{(2n-1)^2 \pi^2} \tag{6}$$

Figure 4:
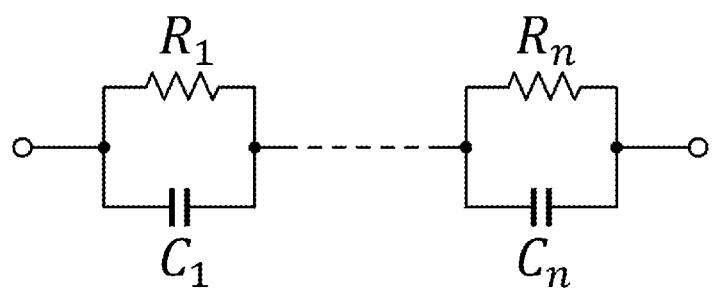
FIG. 4 illustrates an n-th order Foster-type RC ladder circuit that approximates the Warburg impedance.

Representing the above-described approximation as a circuit diagram yields an n-th order Foster-type circuit in which n parallel circuits each formed by a resistor and capacitor are connected in series (see FIG. 4). As is clear from Equation (5) and Equation (6), by using an n-th order Foster-type equivalent circuit model that approximates the Warburg impedance $Z_w$, other parameters of the equivalent circuit (resistance $R_n$, capacitance $C_n$) can be calculated using the diffusion capacitance $C_d$ and the diffusion resistance $R_d$.

Figure 5:
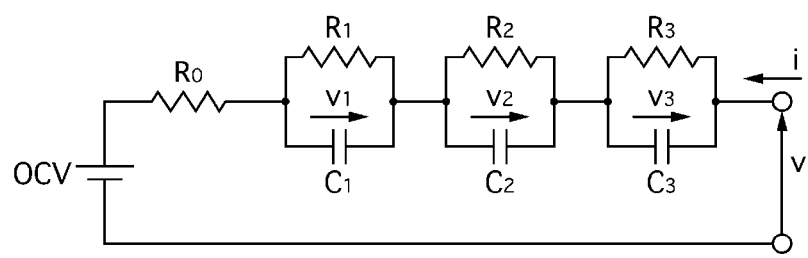
FIG. 5 illustrates a 3rd order Foster-type battery equivalent circuit model.

The following describes a battery equivalent circuit model 41 for the case of approximation with a 3rd order Foster-type circuit (see FIG. 5). In FIG. 5, R represents a resistor, and C represents a capacitor. The order of each is represented in subscript. Letting x be a state variable, u be the input, and y be the output yields the following:

$$x = [SOC\, v_3\, v_2\, v_1]^T \tag{7}$$

$$u = i \tag{8}$$

$$y = v \tag{9}$$

where $v_1$ to $v_3$ are each the voltage drop at the capacitor corresponding to the subscript, i is the current flowing through the entire circuit, and v is the voltage drop of the entire circuit. The superscript T of the matrix represents the transpose of the matrix.

The state space at this time is as follows.

$$\dot{x}(t) = F_f x(t) + G_f u(t) \tag{10}$$

$$y(t) = OCV(SOC) + H_f x(t) + R_0 u(t) \tag{11}$$

$$F_f = \text{diag}\left(0, -\frac{1}{C_3 R_3}, -\frac{1}{C_2 R_2}, -\frac{1}{C_1 R_1}\right) \tag{12}$$

$$G_f = \left[\frac{1}{FCC} \quad \frac{1}{C_3} \quad \frac{1}{C_2} \quad \frac{1}{C_1}\right]^T \tag{13}$$

$$H_f = [0 \quad 1 \quad 1 \quad 1] \tag{14}$$

Equation (10) is an equation of state, and Equation (11) is an output equation.

Next, approximation with continued-fraction expansion is described. As shown in Equation (15), the Warburg impedance $Z_w$ can be represented by continued-fraction expansion:

$$Z_W(s) = \lim_{n \to \infty}\left[0; \frac{1}{R_1}, \frac{1}{sC_1}, \ldots, \frac{1}{R_n}, \frac{1}{sC_n}\right] \tag{15}$$

$$= \cfrac{1}{\cfrac{1}{R_1} + \cfrac{1}{\cfrac{1}{sC_1} + \cfrac{1}{\cfrac{1}{R_2} + \cfrac{1}{\cfrac{1}{sC_2} + \ldots}}}}$$

where the following holds.

$$C_n = \frac{C_d}{4n - 1} \tag{16}$$

$$R_n = \frac{R_d}{4n - 3} \tag{17}$$

Figure 6:
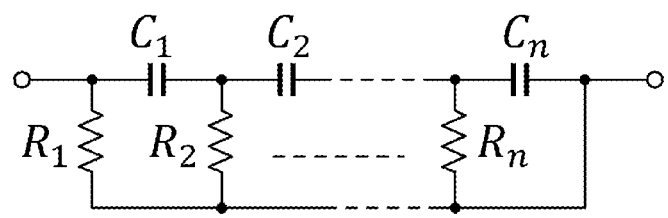
FIG. 6 illustrates an n-th order Cauer-type RC ladder circuit that approximates the Warburg impedance.

Representing the above-described approximation as a circuit diagram yields an n-th order Cauer-type circuit in which n resistors R are connected in parallel between n capacitors C connected in series (see FIG. 6). As is clear from Equation (16) and Equation (17), by using an n-th order Cauer-type equivalent circuit model that approximates the Warburg impedance $Z_w$, other parameters of the circuit (resistance $R_n$, capacitance $C_n$) can be calculated using the diffusion capacitance $C_d$ and the diffusion resistance $R_d$.

Figure 7:
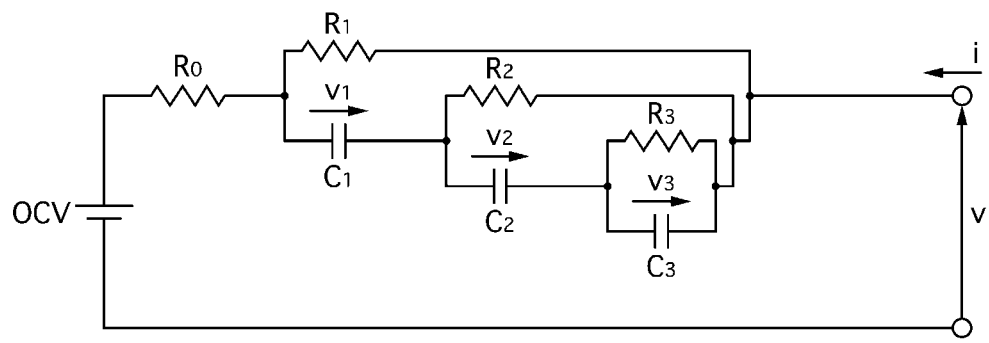
FIG. 7 illustrates a 3rd order Cauer-type battery equivalent circuit model.

The following describes a battery equivalent circuit model 41 for the case of approximation with a 3rd order Cauer-type circuit (see FIG. 7). In FIG. 7, R represents a resistor, and C represents a capacitor. The order of each is represented in subscript. Letting x be a state variable, u be the input, and y be the output yields the following:

$$x = [SOC v_3 v_2 v_1]^T \tag{18}$$

$$u = i \tag{19}$$

$$y = v \tag{20}$$

where $v_1$ to $v_3$ are each the voltage drop at the capacitor corresponding to the subscript, i is the current flowing through the entire circuit, and v is the voltage drop of the entire circuit.

The state space at this time is as follows.

$$\dot{x}(t) = F_c x(t) + G_c u(t) \tag{21}$$

$$y(t) = OCV(SOC) + H_c x(t) + R_0 u(t) \tag{22}$$

$$F_c = -\begin{bmatrix} 0 & 0 & 0 & 0 \\ 0 & \frac{1}{C_3} & \frac{1}{C_3} & \frac{1}{C_3} \\ 0 & 0 & \frac{1}{C_2} & \frac{1}{C_2} \\ 0 & 0 & 0 & \frac{1}{C_1} \end{bmatrix}\begin{bmatrix} 0 & 0 & 0 & 0 \\ 0 & \frac{1}{R_3} & 0 & 0 \\ 0 & \frac{1}{R_2} & \frac{1}{R_2} & 0 \\ 0 & \frac{1}{R_1} & \frac{1}{R_1} & \frac{1}{R_1} \end{bmatrix} \tag{23}$$

$$G_c = \left[\frac{1}{FCC} \quad \frac{1}{C_3} \quad \frac{1}{C_2} \quad \frac{1}{C_1}\right]^T \tag{24}$$

$$H_c = [0 \quad 1 \quad 1 \quad 1] \tag{25}$$

Equation (21) is an equation of state, and Equation (22) is an output equation.

Next, the processing of the estimator 4 is described in detail. In this embodiment, the estimator 4 uses the Kalman filter 42 to estimate, at the same time, the internal state quantity and the parameter values of the battery in either the Foster-type or the Cauer-type battery equivalent circuit model 41. In this embodiment, an Unscented Kalman Filter (UKF) is used for the Kalman filter 42, but a different filter may be used. The UKF uses weighted sampling points called sigma points to approximate a probability distribution and calculate the weighted transition of the sigma points. Specifically, the average and the distribution after transition are calculated for each sigma point and are added in accordance with weights. With this approach, the probability distribution after transition is closer to the true value, and approximation can be performed without an excessive increase in the computational complexity. Furthermore, since the system is not approximated, but rather the probability distribution is approximated at the sigma points, approximation is not restricted by the nonlinearity of the system.

First, in order to estimate the parameters of the battery equivalent circuit model 41 and the internal state quantity of the battery 1 at the same time, the battery equivalent circuit model 41 is rewritten as expanded model. In other words, the model is defined as $$z = [SOC v_3 v_2 v_1 R_0 R_d C_d i]^T \tag{26}$$

$$y = [v \; i]^T \tag{27}$$

where z is a state variable and y is the output in the newly expanded model. The parameters $R_0$, $R_d$, and $C_d$ are added, and the charge/discharge current value i is also treated as a state variable.

In the case of the Foster-type battery equivalent circuit model 41, the state space is as follows.

$$\dot{z}(t) = f_f(z(t)) \tag{28}$$

$$y(t) = h_f(z(t)) \tag{29}$$

-continued $$f_f(z(t)) = \begin{bmatrix} \dfrac{i}{FCC} \\ -\dfrac{25\pi^2 v_3}{4C_d R_d} + \dfrac{2i}{C_d} \\ -\dfrac{9\pi^2 v_2}{4C_d R_d} + \dfrac{2i}{C_d} \\ -\dfrac{\pi^2 v_1}{4C_d R_d} + \dfrac{2i}{C_d} \\ 0 \\ 0 \\ 0 \\ 0 \end{bmatrix} \quad (30)$$

$$h_f(z(t)) = \begin{bmatrix} OCV(SOC) + v_3 + v_2 + v_1 + R_0 i \\ i \end{bmatrix} \quad (31)$$

In the case of the Cauer-type battery equivalent circuit model 41, the state space is as follows.

$$\dot{z}(t) = f_c(z(t)) \quad (32)$$

$$y(t) = h_c(z(t)) \quad (33)$$

$$f_c(z(t)) = \begin{bmatrix} \dfrac{i}{FCC} \\ -\dfrac{165v_3 + 66v_2 + 11v_1}{C_d R_d} + \dfrac{11i}{C_d} \\ -\dfrac{42v_3 + 42v_2 + 7v_1}{C_d R_d} + \dfrac{7i}{C_d} \\ -\dfrac{3v_3 + 3v_2 + 3v_1}{C_d R_d} + \dfrac{3i}{C_d} \\ 0 \\ 0 \\ 0 \\ 0 \end{bmatrix} \quad (34)$$

$$h_c(z(t)) = \begin{bmatrix} OCV(SOC) + v_3 + v_2 + v_1 + R_0 i \\ i \end{bmatrix} \quad (35)$$

The above-described expanded model may be discretized using the Euler method, the Runge-Kutta method, or the like, and the parameters of the battery equivalent circuit model 41 and the internal state quantity of the battery 1 may be estimated at the same time using UKF. The open circuit voltage OCV can be calculated based on the estimated parameters.

Figure 8:
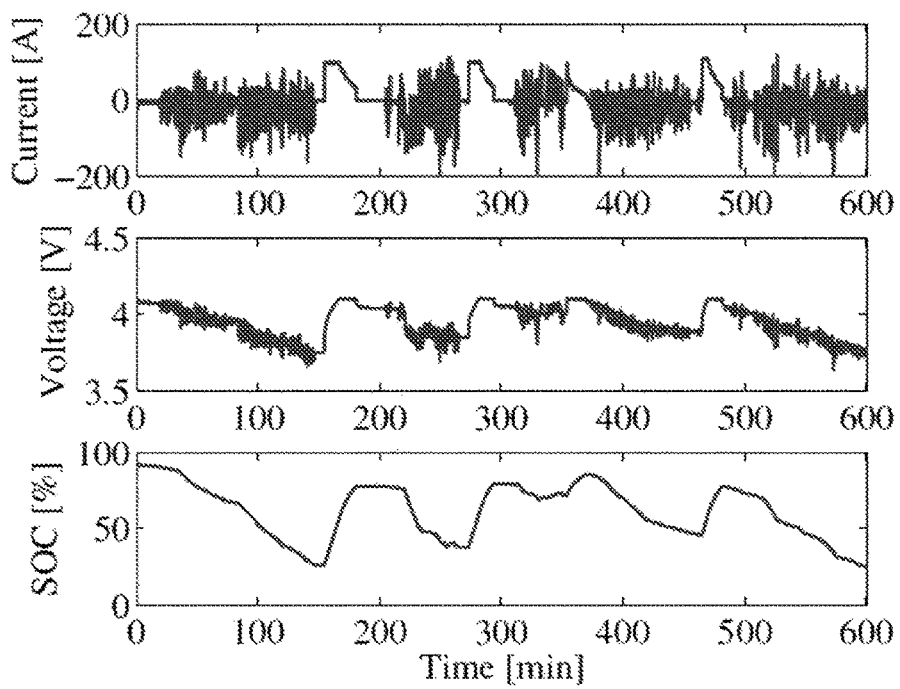
FIG. 8 illustrates measurement data for the current, voltage, and state of charge when an electric vehicle was actually driven.

Next, the results of simulations using data from actually driving an electric vehicle are described. FIG. 8 illustrates measurement data for the current, voltage, and state of charge SOC when an electric vehicle was actually driven. These data on current and voltage are used without modification to estimate the parameters and the state of charge SOC at the same time.

The following three estimation methods were compared.

Figure 9A:
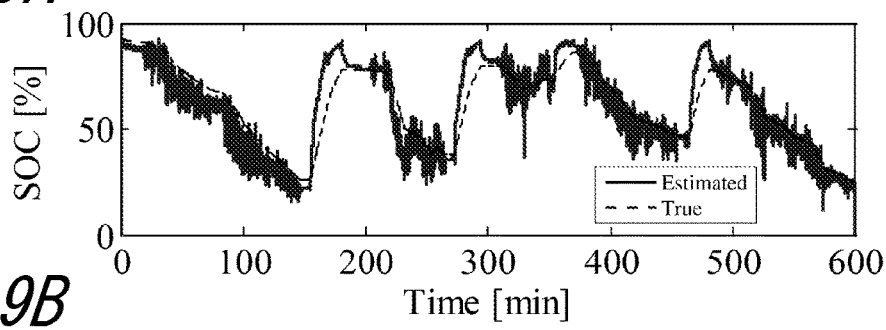
FIGS. 9A and 9B illustrate the estimated state of charge and estimation error when using a 1st order Foster-type battery equivalent circuit model that does not approximate the Warburg impedance $Z_w$.
Figure 9B:
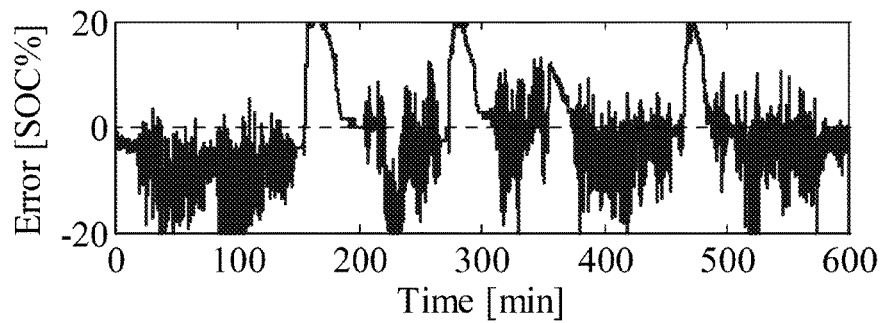

(Simulation 1) FIGS. 9A and 9B illustrate the estimation results for an UKF using a 1st order Foster-type battery equivalent circuit model that does not approximate the Warburg impedance $Z_w$. FIG. 9A illustrates the estimated state of charge SOC and a reference value (true value). FIG. 9B illustrates the error in the state of charge SOC.

Figure 10A:
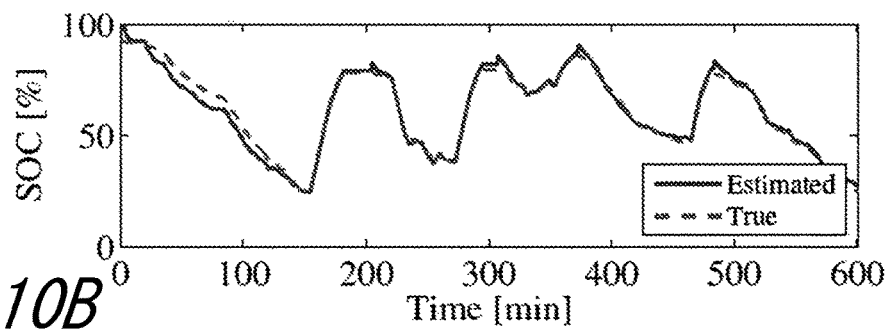
FIGS. 10A and 10B illustrate the estimated state of charge and estimation error when using a 3rd order Foster-type battery equivalent circuit model that approximates the Warburg impedance $Z_w$.
Figure 10B:
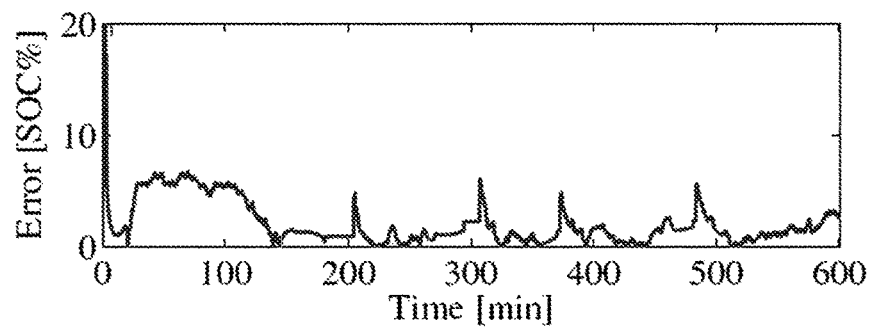
Figure 11A:
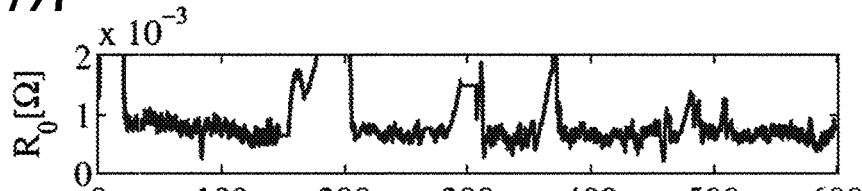
FIGS. 11A, 11B, and 11C illustrate the estimated value of parameters for the case illustrated in FIGS. 10A and 10B.
Figure 11B:
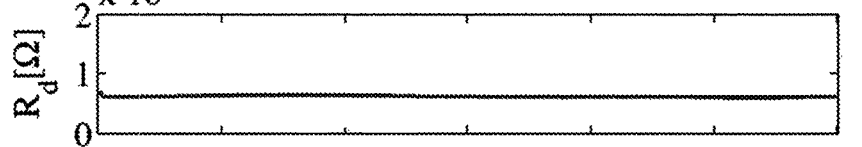
Figure 11C:
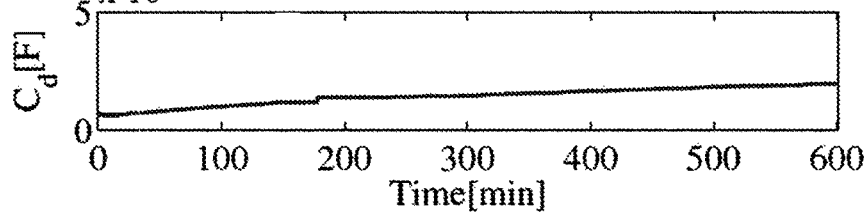

(Simulation 2) FIGS. 10A, 10B, 11A, 11B, and 11C illustrate the estimation results for an UKF using a 3rd order Foster-type battery equivalent circuit model that approximates the Warburg impedance $Z_w$. FIG. 10A illustrates the estimated state of charge SOC and a reference value (true value). FIG. 10B illustrates the error in the state of charge SOC. With respect to elapsed time, FIG. 11A illustrates the change in the parameter $R_0$, FIG. 11B illustrates the change in $R_d$, and FIG. 11C illustrates the change in $C_d$.

Figure 12A:
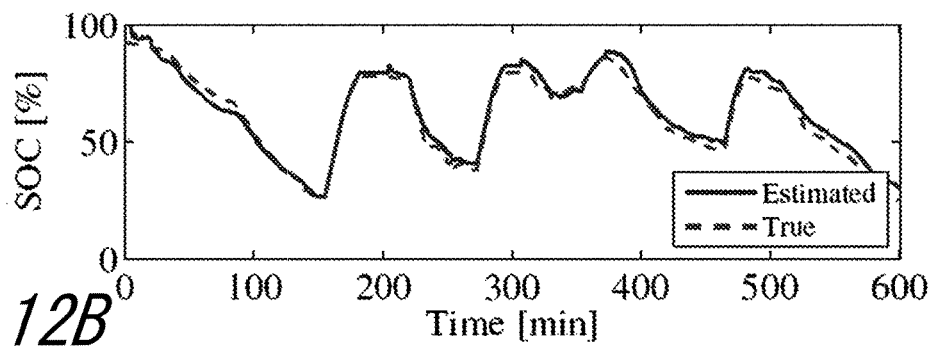
FIGS. 12A and 12B illustrate the estimated state of charge and estimation error when using a 3rd-order Cauer-type battery equivalent circuit model that approximates the Warburg impedance $Z_w$.
Figure 12B:
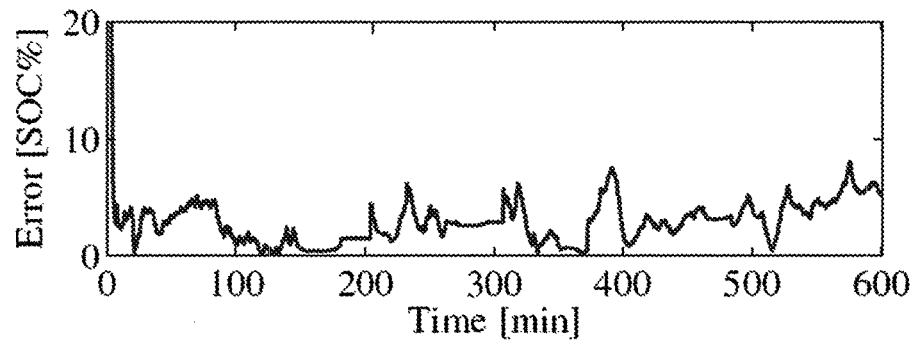
Figure 13A:
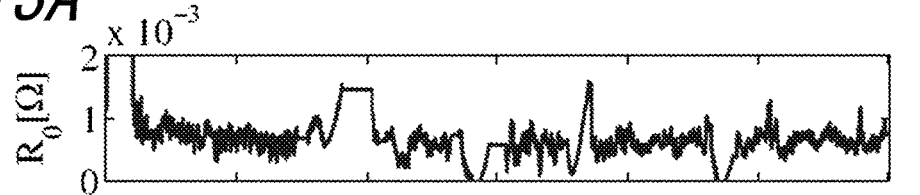
FIGS. 13A, 13B, and 13C illustrate the estimated value of parameters for the case illustrated in FIGS. 12A and 12B.
Figure 13B:
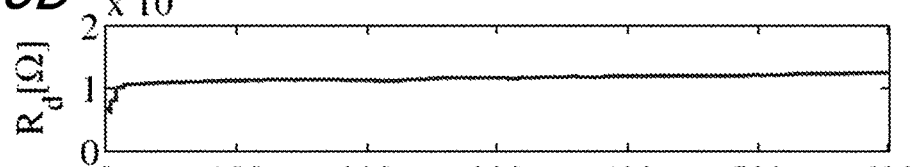
Figure 13C:
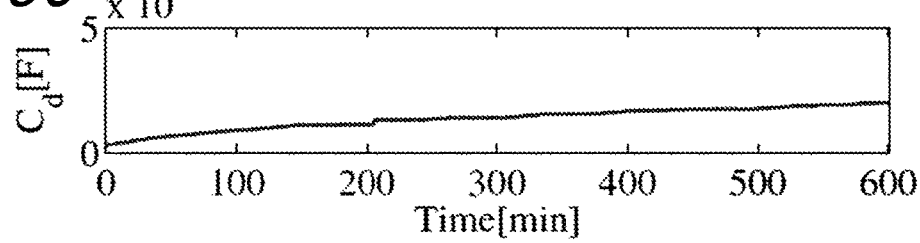

(Simulation 3) FIGS. 12A, 12B, 13A, 13B, and 13C illustrate the estimation results for an UKF using a 3rd order Cauer-type battery equivalent circuit model that approximates the Warburg impedance $Z_w$. FIG. 12A illustrates the estimated state of charge SOC and a reference value (true value). FIG. 12B illustrates the error in the state of charge SOC. With respect to elapsed time, FIG. 13A illustrates the change in the parameter $R_0$, FIG. 13B illustrates the change in $R_d$, and FIG. 13C illustrates the change in $C_d$.

In Simulation 1, there are three parameters to be estimated for the 1st order Foster-type equivalent circuit: $R_0$, $R_1$, and $C_1$. In Simulations 2 and 3, since the Warburg impedance $Z_w$ is approximated, there are three parameters to be estimated for the 3rd order Foster-type (or Cauer) equivalent circuit: $R_0$, $R_d$, and $C_d$. In this way, the number of parameters to be estimated is the same in Simulations 1 to 3.

Based on the above results and on simulation results for driving patterns other than those listed above, the following conclusions may be drawn.

In Simulation 1, as is clear from FIGS. 9A and 9B, the estimated state of charge SOC had a large estimation error (noise). By contrast, the state of charge SOC estimated in Simulations 2 and 3 could be estimated as a value closer to the reference value than the results for Simulation 1 (see FIGS. 10A, 10B, 12A, and 12B).

On the other hand, comparing Simulations 2 and 3 shows that in Simulation 2, the estimated state of charge SOC is punctuated throughout by large spikes in the estimation error (see FIG. 10A), which lower the estimation accuracy as compared to Simulation 3.

In this way, the apparatus for battery parameter estimation according to this embodiment approximates the Warburg impedance $Z_w$ of the battery 1, thereby allowing the Warburg impedance $Z_w$ to be converted into the time domain and allowing the parameters of the battery equivalent circuit model 41 to be estimated.

The estimator 4 also allows other parameters (resistance R, capacitance C) of the battery equivalent circuit model 41 to be calculated using the estimated diffusion resistance $R_d$ and diffusion capacitance $C_d$. Therefore, even if the order of the battery equivalent circuit model 41 increases, the number of parameters to be estimated does not change, thereby allowing the computation load to be reduced. For example, in an n-th order Foster-type equivalent circuit model, when the Warburg impedance is not approximated, there are 2n+1 parameters to be estimated ($R_0$, $R_1$ to $R_n$, and $C_1$ to $C_n$). When approximating the Warburg impedance, however, there are three parameters to be estimated ($R_0$, $R_d$, $C_d$).

When using an n-th order Foster-type circuit as the battery equivalent circuit model 41, the other parameters can be calculated with Equation (5) and Equation (6).

When using an n-th order Cauer-type circuit as the battery equivalent circuit model 41, the other parameters can be calculated with Equation (16) and Equation (17).

(Modification)

Next, a modification to the above embodiment is described. In the apparatus for battery parameter estimation according to the modification, the processing executed by the estimator 4 differs from that of the above embodiment.

As in the above embodiment, the estimator 4 estimates the parameters of the battery equivalent circuit model 41. The estimator 4 differs, however, from the above embodiment by using estimated parameters to calculate the internal state quantity of the battery 1 by computation.

In greater detail, the estimator 4 calculates the transition of the state variable x according to Equation (36), without using the Kalman filter 42.

$$\dot{x} = f(x, \theta, u) \quad (36)$$

On the other hand, to estimate the parameters, the Kalman filter 42 is applied, with the equation of state and output equation being as follows.

$$\dot{\theta} = 0 \quad (37)$$

$$y = h(x, \theta, u) \quad (38)$$

For approximation with a 3rd order Cauer-type circuit, however, the state space is as follows.

$$x = [SOC \quad v_3 \quad v_2 \quad v_1]^T \quad (39)$$

$$\theta = [R_0 \quad R_d \quad C_d]^T \quad (40)$$

$$u = i \quad (41)$$

$$f(x, \theta, u) = \begin{bmatrix} \dfrac{i}{FCC} \\ -\dfrac{25\pi^2 v_3}{4 C_d R_d} + \dfrac{2i}{C_d} \\ -\dfrac{9\pi^2 v_2}{4 C_d R_d} + \dfrac{2i}{C_d} \\ -\dfrac{\pi^2 v_1}{4 C_d R_d} + \dfrac{2i}{C_d} \end{bmatrix} \quad (42)$$

$$h_f(z(t)) = \begin{bmatrix} OCV(SOC) + v_3 + v_2 + v_1 + R_0 i \\ i \end{bmatrix} \quad (43)$$

In this way, the apparatus for battery parameter estimation according to this modification to the above embodiment can be applied when only estimating the parameters of the battery equivalent circuit model 41 using a Kalman filter.

Although this disclosure is based on drawings and examples, it is to be noted that various changes and modifications will be apparent to those skilled in the art based on this disclosure. Therefore, such changes and modifications are to be understood as included within the scope of this disclosure. For example, the functions and the like included in the various units, steps, and the like may be reordered in any logically consistent way. Furthermore, units, steps, and the like may be combined into one or divided.

For example, although the Warburg impedance $Z_w$ is approximated with an infinite series expansion or continued-fraction expansion in the above embodiment, the Warburg impedance $Z_w$ may be approximated with any method. An infinite product expansion, for example, could be used for approximation.

REFERENCE SIGNS LIST

1 Battery
2 Voltage sensor (terminal voltage detector)
3 Current sensor (charge/discharge current detector)
4 Estimator
41 Battery equivalent circuit model
42 Kalman filter
5 Electric charge calculator
6 State of charge calculator
7 State of health calculator

The invention claimed is:

1. An apparatus for battery parameter estimation, the apparatus comprising:
a charge/discharge current detector configured to detect a charge/discharge current value of a battery;
a terminal voltage detector configured to detect a terminal voltage value of the battery; and
an estimator configured to estimate parameters in a battery equivalent circuit model that includes an approximate circuit of a Warburg impedance of the battery,
wherein the estimator estimates a diffusion resistance $R_d$ and a diffusion capacitance $C_d$ of the battery based on the charge/discharge current value and the terminal voltage value, and translates the estimated diffusion resistance $R_d$ and the estimated diffusion capacitance $C_d$ to the parameters.

2. The apparatus of claim 1, wherein the estimator translates the estimated diffusion resistance $R_d$ and the estimated diffusion capacitance $C_d$ to the parameters based on approximate equations of the Warburg impedance.

3. The apparatus of claim 2, wherein
the equivalent circuit model is an n-th order Foster equivalent circuit model, and
the estimator translates the estimated diffusion resistance $R_d$ and the estimated diffusion capacitance $C_d$ to the parameters with the following approximate equations:

$$C_n = \frac{C_d}{2}$$

$$R_n = \frac{8 R_d}{(2n - 1)^2 \pi^2}.$$

4. The apparatus of claim 2, wherein
the equivalent circuit model is an n-th order Cauer equivalent circuit model, and
the estimator translates the estimated diffusion resistance $R_d$ and the estimated diffusion capacitance $C_d$ to the parameters with the following approximate equations:

$$C_n = \frac{C_d}{4n - 1}$$

$$R_n = \frac{R_d}{4n - 3}.$$

5. The apparatus of claim 1, wherein the estimator estimates an internal state quantity of the battery at a same time as the parameters in the equivalent circuit model.

6. The apparatus of claim 2, wherein the estimator estimates an internal state quantity of the battery at a same time as the parameters in the equivalent circuit model.

7. The apparatus of claim 3, wherein the estimator estimates an internal state quantity of the battery at a same time as the parameters in the equivalent circuit model.

8. The apparatus of claim 4, wherein the estimator estimates an internal state quantity of the battery at a same time as the parameters in the equivalent circuit model.

9. A method for battery parameter estimation, the method comprising:
detecting a charge/discharge current value of a battery;
detecting a terminal voltage value of the battery; and estimating parameters in a battery equivalent circuit model that includes an approximation circuit approximating a Warburg impedance of the battery,
wherein estimating parameters comprises estimating a diffusion resistance $R_d$ and a diffusion capacitance $C_d$ of the battery based on the charge/discharge current value and the terminal voltage value, and translating the estimated diffusion resistance $R_d$ and the estimated diffusion capacitance $C_d$ to the parameters.

* * * * *